United States Patent [19]

Fazio

[11] Patent Number: 4,820,960
[45] Date of Patent: Apr. 11, 1989

[54] FAST RETRACE CIRCUIT FOR A DEFLECTION AMPLIFIER IN A CATHODE RAY TUBE

[75] Inventor: James A. Fazio, Windsor, Conn.

[73] Assignee: United Technologies Corporation, Hartford, Conn.

[21] Appl. No.: 101,513

[22] Filed: Sep. 28, 1987

[51] Int. Cl.[4] .................... H01J 29/70; H01J 29/72
[52] U.S. Cl. .................................. 315/397; 315/389
[58] Field of Search .............. 315/387, 388, 389, 403, 315/395

[56] References Cited

U.S. PATENT DOCUMENTS 4,547,711 10/1985 Gehrmann ........................ 315/408
4,677,352 6/1987 Sibovits et al. .................... 315/408

Primary Examiner—Theodore M. Blum
Attorney, Agent, or Firm—Francis J. Maguire, Jr.

[57] ABSTRACT

A method and apparatus for the fast retrace of the electron beam in a cathode ray tube are disclosed. A deflection signal is presented to a cathode ray tube deflection system upon the detection of the end of the retrace period of the deflection signal so that a cathode ray tube electron beam can scan across the screen of the cathode ray tube. Upon detecting the beginning of the retrace period of the deflection signal, a forcing signal is presented to the cathode ray tube deflection system. The presenting of the forcing signal to the deflection system quickly reverses the direction of the current flow through the deflection system and allows for the electron beam to slew to its initial position and settle before the end of the normal retrace period.

7 Claims, 2 Drawing Sheets

FAST RETRACE CIRCUIT FOR A DEFLECTION AMPLIFIER IN A CATHODE RAY TUBE

DESCRIPTION

1. Technical Field

The invention relates to deflection amplifiers having a fast retrace capability

2. Background Art

In a cathode ray tube (CRT) display, deflection amplifier has circuitry, commonly called "retrace circuitry", which controls the slew-rate of the CRT electron beam during the retrace portion of the deflection signal. The slew-rate is that period of time necessary for the current in the CRT deflection system to reverse in direction and allow for the electron beam to return to its initial position and settle. The prior art shows two well known and distinct retrace circuits One of the prior art circuits consists of a linear deflection amplifier retrace system which consists of a power amplifier, a damping resistor, a sensing resistor, and an inductance. The power amplifier is an operational amplifier having the deflection signal feeding into its non-inverting input and the amplifier output feeding the inverting input as a closed feedback loop. This closed feedback loop consists of the CRT deflection system and the damping resistor in parallel between the amplifier output and the inverting input while a sensing resistor runs from the inverting amplifier input to ground. During normal operations, the operational amplifier keeps the voltage magnitude between both the noninverting and inverting inputs the same. Hence, during the trace portion of the deflection signal, the electron beam tracks the deflection signal. The damping resistor in this circuit serves the function of reducing the noise and smoothing out the amplifier output signal going to the deflection system while the sensing resistor serves as a current sensing device for the feedback loop to the negative amplifier input. Generally, the sensing resistor is kept as small as possible, usually around one ohm, to keep the Q factor large (i.e., the Q factor being defined as the inductance divided by the resistance) to save power. The single problem associated with the linear deflection amplifier system is the deflection system inductance During a fast retrace (i.e., retraces requiring completion in less than 10 microseconds), the operational amplifier cannot keep the voltage magnitude between both the positive and negative inputs the same because of the inductance of the deflection system. Hence, the electron beam is not given enough time and does not slew back to its initial position and settle before the starting the next scanning sequence on the screen.

The second well known retrace circuit is the resonant deflection system which consists of a high voltage breakdown transistor, a diode, a capacitor, and the inductance of the deflection system. The deflection system is attached to a high voltage source on one end and to the collector of the transistor on the other end. The base of the transistor is attached to phase lock loop circuitry while the emitter runs to ground. In parallel with the collector-emitter of the transistor is a diode while in parallel with the deflection system is a capacitor. During the trace portion of the deflection signal, the transistor is turned on and the current flows from the deflection system through the collector and emitter to ground while the electron beam scans across the screen. During the retrace portion of the deflection system, the transistor is turned off and the current through the deflection system causes an oscillation in a self-resonant circuit consisting of the inductance of the deflection system and the capacitor. This oscillation continues throughout the retrace period during which time the current through the deflection system reverses polarity and attains a negative magnitude almost equaling the original positive magnitude of the current. The self-resonant frequency of the deflection system inductance in parallel with the capacitor must be high enough to permit the completion of the full current reversal within the blanking pulse interval while the value of the capacitance chosen controls the width of the retrace signal. Although using very little power, the resonant deflection system has several disadvantages. First, the resonant deflection circuit only controls the voltage to the deflection system and not the current through the deflection system. Hence, this circuit cannot correct any distortions appearing on the screen except for pincushioning or barrel type distortion. Second, the resonant deflection circuit can only be interrupted upon the completion of either a trace or retrace period. Hence, the resonant deflection circuit cannot be used in display systems which use the electron beam as a writing instrument (i.e., the electron beam actually writing characters onto the screen much like a human writing with a pen) rather than just a scanning device.

DISCLOSURE OF THE INVENTION

An object of the present invention is to provide a retrace circuit for a deflection amplifier in a CRT which allows the CRT electron beam to quickly slew back to its initial position and settle in order to permit uses of the electron beam during the retrace period.

Another object of the present invention is to provide a retrace circuit for a deflection amplifier in a CRT which allows the amplitude of the deflection signal to change without causing any discontinuities to occur in the amplified deflection signal appearing across a sensing resistor.

As in the prior art, a deflection signal is presented to a cathode ray tube deflection system upon the detection of the end of a retrace period of the deflection signal so that the cathode ray tube electron beam can scan across the screen of the CRT. However, according to the present invention, upon detecting the beginning of the retrace period of the deflection signal, a forcing signal is presented to the cathode ray tube deflection system. The presenting of the forcing signal to the deflection system quickly reverses the direction of the current flow through the deflection system and allows for the electron beam to quickly slew to an initial position and settle before the end of the normal retrace period.

The present invention represents a very important advancement over previous retrace circuits because it allows the CRT electron beam to slew to a potentially different initial position after every slewing sequence and settle before the completion of one half of the retrace period. This permits other scanning modes to be employed during the remainder of the retrace period. This retrace technique can also be used to compensate for numerous different types of distortions (pin cushion and barrel type distortions, for example) while still completing the retrace sequence in only one half of the retrace period. For example, it is expected that the present invention will find widespread application in electro-optic display systems in which the CRT must compensate for distortions which complex optics can cause.

BEST MODE FOR CARRYING OUT THE INVENTION

Figure 1:
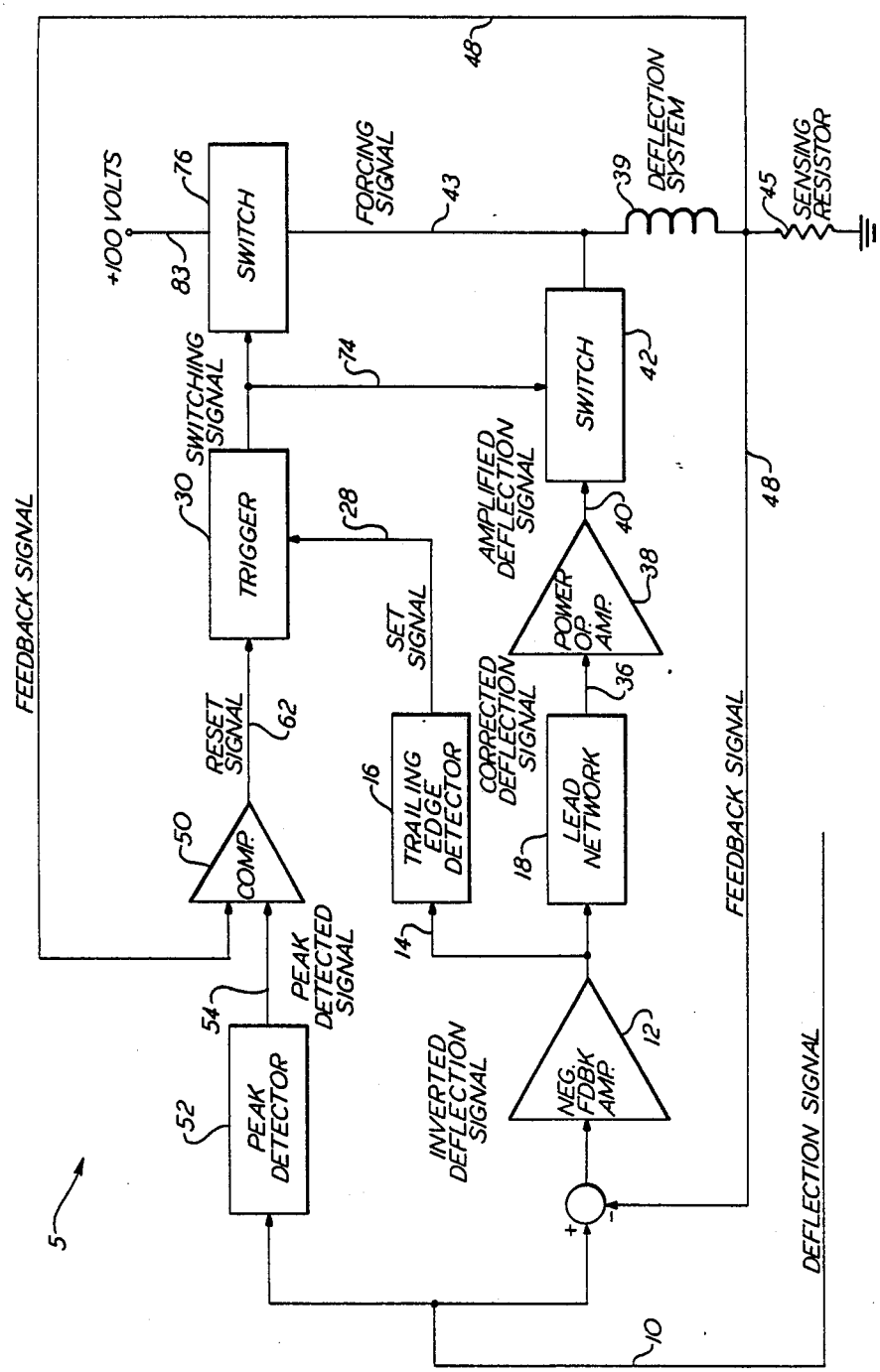
FIG. 1 is a block diagram representation of a number of circuits comprising a fast retrace circuit for a deflection amplifier for a cathode ray tube, according to the present invention.
Figure 2:
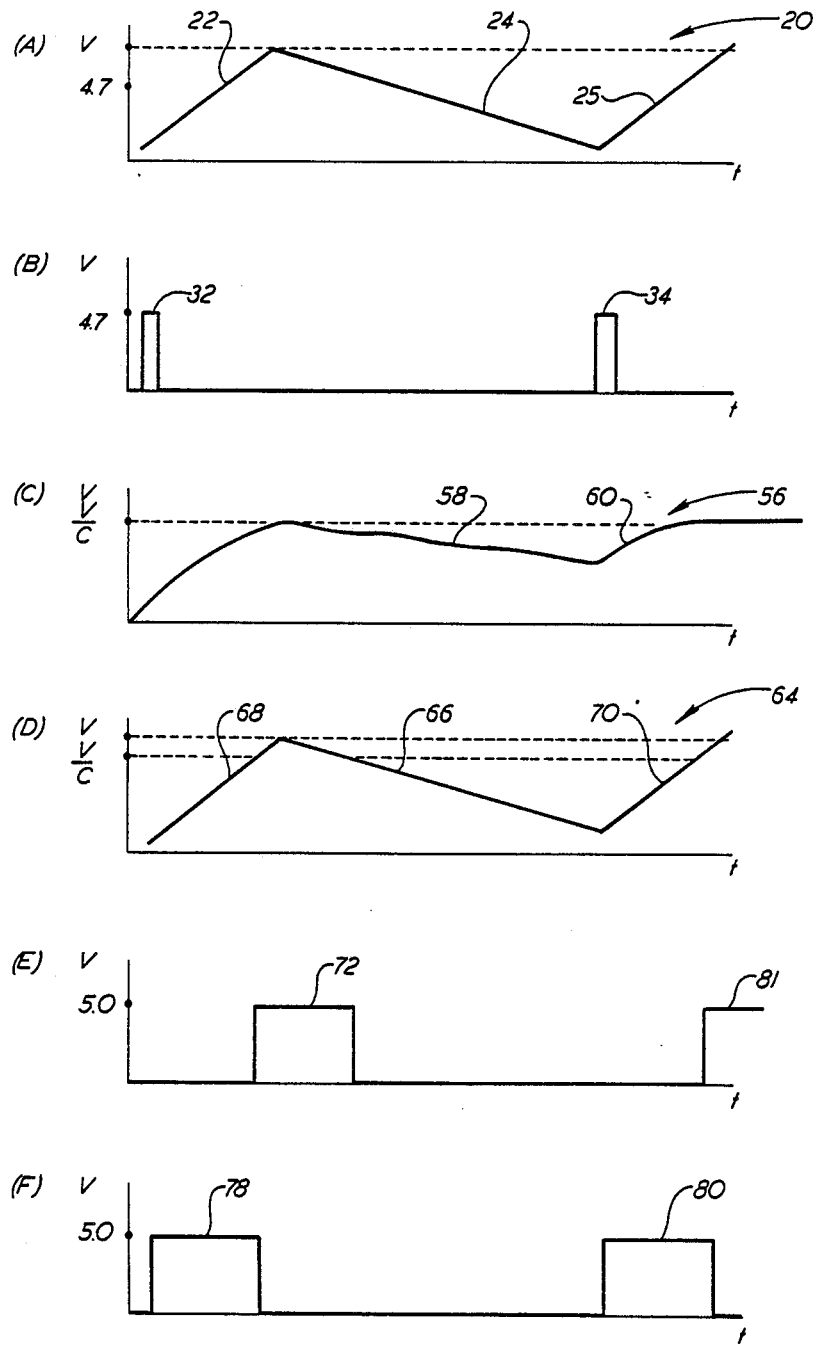
FIG. 2(A)-(F) is an illustration of several waveforms representing several of the signals found in FIG. 1.

FIG. 1 is a block diagram representation of a fast retrace circuit 5 fed by a deflection amplifier (not shown) for controlling the deflection of an electron beam in a cathode ray tube (not shown). Upon receiving a deflection signal on a line 10 from the deflection amplifier, a negative feedback operational amplifier 12 inverts this signal and transmits an inverted deflection signal on a line 14 to both a trailing edge detector circuit 16 and a lead network circuit 18. The inverted deflection signal on the line 14 in FIG. 1 is also illustrated in FIG. 2(A). An inverted deflection signal waveform 20 in FIG. 2(A) consists of alternating retrace and trace periods 22 and 24 respectively. The magnitude of the peak-to-peak voltage (V) of the inverted deflection signal waveform 20 can be held constant, for the non-corrected case, or can depend upon the geometric correction which may be applied before each and every scanning sequence by changing the initial starting position. Since the embodiment of FIG. 1 can be part of an electro-optic display system, the CRT deflection circuitry can be designed to compensate for distortions which such optics cause (pin cushioning and barrel type being just a few of the types of distortions which the optics may cause). In order to compensate for these distortions, the magnitude of the peak-to-peak voltage (V) of the inverted deflection signal can be controlled at a different magnitude for each and every scanning sequence. Hence, the peak-to-peak voltage necessary to drive a sufficient current through the CRT deflection system and allow for the scanning of the electron beam can differ in magnitude in each and every scanning sequence, as controlled by the magnitude of the deflection signal on line 10.

The inverted deflection signal 20 illustrated in FIG. 2(A) is transmitted to both the trailing edge detector circuit 16 and the lead network circuit 18. Both the lead network circuit 18 and the trailing edge detector circuit 16 are well known in the art. Typically, the trailing edge detector circuit 16 consists of a voltage divider made up of a resistor and a zener diode; the input is connected to the resistor while the output is connected to a node between the resistor and the zener with the zener diode running from the output to ground. The purpose of the trailing edge detector circuit 16 is to detect the beginning of the retrace period 22 or of a retrace period 25, of the inverted deflection signal 20 and to send a positive digital (i.e., voltage magnitude equaling the zener forward biasing voltage of around 4.7 volts) pulse to a triggering device. In FIG. 1, the trailing edge detector circuit 16 sends a set signal on a line 28 to a triggering device 30 upon the detection of the beginning of each retrace period. FIG. 2(B) illustrates a pair of pulses 32, 34 corresponding, respectively, to the set signal on the line 28 in FIG. 1 and triggered by the two retraces 22, 25 of FIG. 2(A). In FIG. 2(B), the set signal 32 and 34, respectively, are shown occurring at the beginning of the retrace periods 22 and 25 respectively, of the inverted deflection signal waveform 20.

Returning now to FIG. 1, the purpose of the lead network circuit 18 is to correct the phase response and to improve the stability of the closed loop network consisting of the negative feedback operational amplifier, the lead network circuit, a power operational amplifier 38, and a CRT deflection system 39. The lead network circuit accomplishes this goal by providing the input signal with less than unity gain at high frequencies. The lead network circuit 18 corrects the inverted deflection signal and presents a corrected deflection signal on a line 36 to the power operational amplifier 38 which amplifies and presents an amplified deflection signal on a line 40 to a switch 42. The operation of the switch 42 and that of a second, related switch will be further explained and clarified further on in this disclosure, but for now, assume the switch 42 is in a closed position. In the closed position, the amplified deflection signal appears on a line 43 and is impressed across the deflection system 39 and a sensing resistor 45. The deflection system controls the electron beam (not shown) in scanning normally across the screen of the cathode ray tube (not shown). The sensing resistor 45 detects any changes in the current through the deflection system while the voltage across the sensing resistor is provided as a deflection system feedback signal on a line 48 to the negative feedback operational amplifier 12 and to a comparator 50.

The deflection signal on the line 10 is also presented to a peak detector circuit 52. Peak detector circuits are well known to those skilled in the art and typically consist, for example, between the input and the output, of a first capacitor in parallel with a first resistor, a second resistor in series with the first resistor, a second capacitor in parallel with the first and second resistor, and a diode feeding the second capacitor. Of course, other peak detectors are known as well. The purpose of the peak detector circuit is to determine the positive peak level of a periodic signal and to send a signal indicative of the positive peak as an output. In FIG. 1, the peak detector 52 determines the positive peak level of the deflection signal on the line 10 and provides a peak detected signal on a line 54 indicative of the positive peak of the deflection signal to the comparator 50. FIG. 2(C) illustrates a waveform 56 indicative of the voltage of the peak detected signal on the line 54 in FIG. 1. The peak detected signal waveform 56 shows a signal indicative of a capacitor discharge phase 58 during the trace portion 24 of the deflection signal waveform 20 and a capacitor charge phase 60 during the retrace portion 25 of the deflection signal waveform 20. The magnitude of the peak detected signal waveform 56 is dependent upon the value of the capacitance chosen and the peak value is generally chosen somewhat smaller (V/C) than the anticipated magnitude (V) of the deflection signal 20.

Returning to FIG. 1, the comparator 50 receives the deflection system feedback signal on the line 48 from the sensing resistor 45 and the peak detected signal on the line 54 from the peak detector 52. When the magnitude of the sensed feedback signal equals or exceeds the peak detected signal, the comparator 50 provides a reset signal on a line 62 to the triggering device 30. FIGS. 2(C), (D), and (E) illustrate the function of the comparator 50 in FIG. 1. As previously discussed, FIG. 2(C)

shows the peak detected signal waveform 56 corresponding to the peak detected signal on the line 54 in FIG. 1 having a capacitor discharge phase 58 and a capacitor charge phase 60. FIG. 2(D), which corresponds to the sensed feedback signal on the line 48 in FIG. 1, shows a deflection system feedback signal waveform 64 having a trace period 66, retrace periods 68 and 70, and a voltage magnitude (V) which tracks the inverted deflection signal waveform 20 of FIG. 2(A). FIG. 2(E), corresponding to the reset signal on the line 62 in FIG. 1, shows a positive digital pulse 72 occurring when the magnitude of the deflection system feedback signal on the line 48 as shown by the waveform 64 in FIG. 2(D) equals or exceeds the peak detected signal on line 54 as shown by the waveform 56 in FIG. 2(C).

Returning to FIG. 1, the triggering device 30 sends a switching signal on a line 74 to a switch 76 and the switch 42 for the period of time between the beginning of the set signal on the line 28 and the beginning of the reset signal on the line 62. FIG. 2(F) shows a waveform 78 having a duration indicative of the duration of the switching signal on line 74 in FIG. 1. The switching signal waveforms 78, 80 in FIG. 2(F) begin with the leading edge of the set signal waveforms 32, 34, respectively, of FIG. 2(B), and end with the leading edge of the reset signal waveform 72, 81, respectively, of FIG. 2(E).

Since the beginning of the retrace portion 22 of the inverted deflection signal waveform 20 of FIG. 2(A) triggers the set signal waveform 32 of FIG. 2(B) and the end of the retrace portion 68 of FIG. 2(D) of the feedback signal waveform 64 triggers the reset signal waveform 72, the switching signal waveform 78 and 80 are only generated during the retrace period. When not receiving a switching signal, the switch 42 is closed which allows for the sending of the amplified deflection signal to the deflection system 39 while the switch 76 is open which prevents the sending of a forcing signal on a line 83 onto the line 43 to the deflection system 39. Upon receipt of the switching signal on the line 74, switch 42 becomes open circuited and switch 76 becomes close circuited which allows the forcing signal on the line 83 to appear on line 43 and hence across the deflection system 44 and the sensing resistor 45. The forcing signal voltage magnitude may, for example, generally be set at, at least, several orders of magnitude larger than the amplified deflection signal voltage magnitude and can be set at the highest allowable rated voltage of the CRT deflection system. Since the voltage across the inductance of the deflection system follows the electrical formula V=L (di/dt) where L is a known constant, this higher voltage magnitude of the forcing signal allows the current through the deflection system to reverse direction faster than if only the lower voltage magnitude of the amplified deflection signal were presented to the deflection system. Hence, the forcing signal allows the electron beam to slew to its initial position and settle well before the end of a normal ten microsecond retrace period.

Although the invention has been shown and described with respect to a best mode embodiment thereof, it should be understood by those skilled in the art that the foregoing and various other changes, omissions, and additions in the form and detail thereof maybe made therein without departing from the spirit and scope of the invention.

I claim:

1. A method for the retrace of a cathode ray tube (CRT) electron beam during a retrace period of a periodic deflection signal having alternating trace and retrace periods which signal is provided to a CRT's deflection system, comprising the steps of:
    providing the periodic deflection signal to the CRT's deflection system after the retrace period so as to control the CRT electron beam so as to scan across the CRT's screen during the trace period; and
    providing a forcing signal to the CRT's deflection system at the beginning of the retrace period so as to reverse the direction of current flow through the deflection system and allow for the CRT electron beam to slew to an initial position and settle before the beginning of the trace period.

2. Apparatus for the fast retrace of a cathode ray tube (CRT) electron beam during a retrace period of a periodic deflection signal having alternating trace and retrace periods which deflection signal is provided to the CRT's deflection system, comprising:
    means for providing the periodic deflection signal to the CRT's deflection system after the retrace period so as to control the CRT electron beam so as to scan across the CRT's screen during the trace period; and
    means for providing a forcing signal to the CRT's deflection system at the beginning of the retrace period so as to reverse the direction of current flow through the deflection system and allow for the CRT electron beam to slew to an initial position and settle before the beginning of the trace period.

3. Circuitry for providing a deflection signal, having both trace and retrace periods, to a cathode ray tube magnetic deflection yoke, comprising:
    means responsive to the magnitude of the deflection signal for providing a switching signal upon detecting a changeover from one deflection signal period to another; and
    switching means, responsive to the deflection signal, said switching signal and to a forcing signal, for providing said forcing signal to the yoke immediately at the beginning of said retrace period and for providing said deflection signal to the yoke during said trace period.

4. The circuitry of claim 3, wherein said means responsive to the magnitude if the deflection signal comprises:
    retrace detection circuitry, responsive to a deflection signal, for providing a set signal at the beginning of a retrace period;
    peak detection circuitry, responsive to said deflection signal, for providing a peak signal indicative of the peak magnitude thereof;
    a comparator, responsive to said peak signal and a feedback signal indicative of the magnitude of the current in the yoke, for comparing the magnitude of said peak signal to that of said feedback signal and for providing a reset signal upon determining that the magnitude of said feedback signal is equal or greater than that of said peak signal; and
    a triggering device, responsive to said set signal for providing a switching signal during said retrace period, and responsive to said reset signal for ceasing providing said switching signal substantially at the end of said retrace period.

5. The circuitry of claim 3, wherein said switching circuitry comprises:

a first switch, responsive to said switching signal and responsive to said deflection signal, for providing said deflection signal to the yoke in each trace period commencing after each retrace period.

a second switch responsive to said switching signal and responsive to said forcing signal, for providing said forcing signal to the yoke in each retrace period.

6. Circuitry for providing a deflection signal (10) for ordering a current level in a cathode ray tube magnetic deflection yoke, comprising:

an amplifier (12), responsive to the sum of the deflection signal and a feedback signal (48) having a magnitude indicative of the actual magnitude of the current in the yoke, for providing an amplified error signal (14);

retrace detection circuitry (16), responsive to said error signal (14), for providing a set signal (28) at the beginning of a retrace period;

peak detection circuitry (52), responsive to said deflection signal (10), for providing a peak signal (54) indicative of the peak magnitude thereof;

a comparator (50), responsive to said peak signal and said feedback signal (48), for comparing the magnitude of said peak signal to that of said feedback signal and for providing a reset signal (62) upon determining that the magnitude of said feedback signal is equal or greater than that of said peak signal;

a triggering device (30), responsive to said set signal for providing a switching signal (74) during said retrace period, and responsive to said reset signal for ceasing providing said switching signal substantially at the end of said retrace period;

a first switch (42), responsive to said switching signal and responsive to said deflection signal (10), for providing said deflection signal to the yoke in a trace period commencing after said retrace period, between said ceasing providing said switching signal and said providing said switching signal; and a second switch (76), responsive to said switching signal and responsive to a forcing signal (83), for providing said forcing signal to the yoke in said retrace period between said providing said switching signal and said ceasing providing said switching signal.

7. Circuitry for providing a deflection signal having successive trace and retrace periods to a cathode ray tube magnetic deflection yoke, comprising:

means responsive to the deflection signal for providing a first switching signal upon detecting a change from a trace period to a retrace period;

means responsive to the deflection signal and to a feedback signal indicative of the magnitude of current in the yoke for comparing the peak magnitude of the deflection signal to the magnitude of said feedback signal for providing a second switching signal upon detecting said feedback signal having a magnitude greater than or equal to said peak magnitude of the deflection signal;

means responsive to the difference in magnitudes between the deflection signal and said feedback signal for providing, in response to said second switching signal, a difference signal to the yoke during trace periods; and means responsive to said first switching signal and to a forcing signal for providing said forcing signal to the yoke during retrace periods in response to said first switching signal.

* * * * *